(12) United States Patent
Liu et al.

(10) Patent No.: US 10,658,191 B2
(45) Date of Patent: May 19, 2020

(54) CONFORMAL MIDDLE LAYER FOR A LITHOGRAPHY PROCESS

(71) Applicant: Taiwan Semiconductor Manufacturing Company, Ltd., Hsin-Chu (TW)

(72) Inventors: Chen-Yu Liu, Kaohsiung (TW); Ching-Yu Chang, Hsin-Chu (TW); Ming-Huei Weng, Kaohsiung (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 21 days.

(21) Appl. No.: 14/846,308

(22) Filed: Sep. 4, 2015

(65) Prior Publication Data
US 2017/0069496 A1 Mar. 9, 2017

(51) Int. Cl.
*G03F 7/09* (2006.01)
*H01L 21/3105* (2006.01)
*H01L 21/027* (2006.01)
*G03F 7/075* (2006.01)

(52) U.S. Cl.
CPC ...... *H01L 21/31058* (2013.01); *G03F 7/0752* (2013.01); *G03F 7/091* (2013.01); *H01L 21/0271* (2013.01)

(58) Field of Classification Search
CPC ........ G03F 7/094; G03F 7/095; G03F 7/0752; H01L 21/0271

USPC ....................................................... 430/273.1
See application file for complete search history.

(56) References Cited

U.S. PATENT DOCUMENTS

| | | | | |
|---|---|---|---|---|
| 6,090,902 A * | 7/2000 | Kuo | ....................... | C08F 290/04 526/279 |
| 6,438,307 B1 * | 8/2002 | Kaneko | .................... | G02B 6/13 385/129 |
| 6,661,939 B2 * | 12/2003 | Kaneko | ................ | G02B 6/4214 385/129 |
| 8,587,861 B1 * | 11/2013 | Zhou | .......................... | C09J 4/00 257/40 |
| 9,442,377 B1 * | 9/2016 | Ongayi | ................... | G03F 7/091 |

FOREIGN PATENT DOCUMENTS

| | | | | |
|---|---|---|---|---|
| CA | 2321236 A1 * | 9/1999 | ................ | C08F 2/38 |
| TW | 201120577 | 6/2011 | | |
| TW | 2014012696 | 1/2014 | | |
| TW | 201523156 | 6/2015 | | |

* cited by examiner

*Primary Examiner* — Daborah Chacko-Davis
(74) *Attorney, Agent, or Firm* — Haynes and Boone, LLP

(57) ABSTRACT

A method includes performing a first polymerization process on a monomer solution to form a partially processed resin solution, the partially processed resin solution comprising a solvent and a silicon-based resin, spin coating the partially processed resin solution on a substrate, and performing a second polymerization process on the partially processed resin solution to shrink the partially processed resin solution to form a conformal silicon-based resin layer.

20 Claims, 5 Drawing Sheets

CONFORMAL MIDDLE LAYER FOR A LITHOGRAPHY PROCESS

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

Photolithography is a common process used for the fabrication of integrated circuits. Generally, photolithography involves exposing a photoresist layer to a light source through a patterned mask. The photoresist is then developed to remove various portions of the photoresist material such that the pattern in the mask is formed within the photoresist. Then, various fabrication processes such as etching can be applied. Due to the small feature size, various techniques are used to improve the photolithography process. In one example, a tri-layer resist is used. A tri-layer resist includes a first layer such as a Bottom Anti-Reflective Coating (BARC) layer, a second layer such as a silicon hard mask, and a third layer such as the photoresist. It is desirable to improve photolithographic techniques including those that involve a tri-layer resist.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
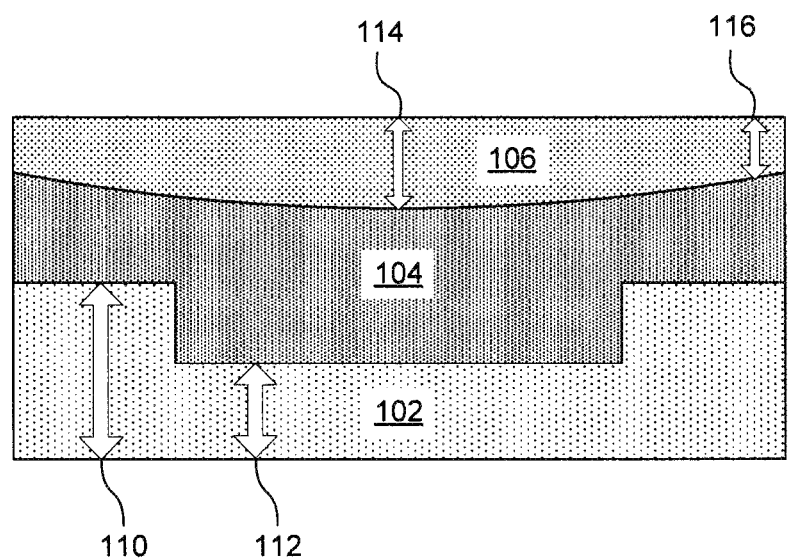
FIG. 1A is a diagram showing an illustrative tri-layer resist with a non-conformal middle layer, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to improve photolithographic techniques including those that involve a tri-layer resist. In many cases, a tri-layer resist is deposited onto a substrate that has a varying topography. For example, the underlying substrate may include a variety of features that were formed during previous fabrication processes. While a Chemical Mechanical Polishing (CMP) process may be applied to the bottom layer of the tri-layer resist, there is still some variation in the surface of the bottom layer. Thus, when the middle layer is applied, there is typically a variation in thickness of the middle layer. This variation in thickness of the middle layer limits the critical dimension that can be used when forming a circuit. Particularly, the lateral etching bias leads to undesired variances in feature sizes. Accordingly, it is desirable to have a middle layer that is more uniform in thickness. Such a middle layer will be more conformal to the underlying bottom layer.

According to principles described herein, various techniques are used to make the middle layer of a tri-layer resist more conformal and more uniform in thickness. According to one example, the middle layer is formed by first creating a monomer solution that includes a solvent and a number of monomers. A monomer is a molecule that is capable of chemically bonding with other monomers to form a polymer. A first polymerization process is then applied to the monomer solution to create a partially processed resin solution. The first polymerization process causes some of the monomers cross-linked such that the molecular weight increases on average. Cross-linked monomers form a molecule that is referred to as a polymer. The partially processed resin solution includes polymers and monomers as well as the solvent. Particularly, after the first polymerization process, the resin solution is not fully cross-linked and there are still linking sites available for further cross-linking. After the first polymerization process, the partially processes resin solution is applied to the wafer, particularly, on the top surface of the bottom layer of the tri-layer resist. Then, a second polymerization process, which includes a baking process, is applied to the partially processed resin solution that has been applied to the wafer. The second polymerization process causes additional cross-links to occur. According to principles described herein, the nature of the first polymerization process and the nature of the monomer solution are such that fewer cross-links occur during the first polymerization process and instead occur during the second polymerization process. This leads to additional shrinkage of the applied middle layer. As will be described in further detail below, the additional shrinkage results in a middle layer with a more uniform thickness.

According to principles described herein, the characteristics of the monomer solution can be selected to cause additional shrinkage during the second polymerization process. For example, the solvent can be selected to have a high boiling point so that there is more solvent within the solution when it is applied to the substrate. As will be described in further detail below, during the spin coating process (and/or during the baking process), more solvent will spin out, thus leading to a more conformal middle layer. Additionally, the types of monomers can be selected to have various properties that will cause the middle layer to shrink more during the baking process. Again, as will be described in further detail below, this results in a more conformal middle layer.

FIG. 1A is a diagram showing an illustrative tri-layer resist with a non-conformal middle layer. According to the present example, the first two layers of a tri-layer resist are shown deposited on a substrate 102. The first two layers include a bottom layer 104 and a middle layer 106. In some cases, the bottom layer 104 is referred to as the first layer and the middle layer 106 is referred to as the second layer.

The substrate 102 may be any suitable material that is to be patterned using principles described herein. In one example, the substrate 102 is a semiconductor substrate, such as a semiconductor wafer. Such a substrate 102 sometimes has a varying topography. Particularly, one portion of the substrate 102 may have a first height 110 and another portion of the substrate 102 may have a second height 112 that is less than the first height 110. Such varying topography may have resulted from previous fabrication processes performed on the substrate 102. For example, various features may be etched into the substrate 102 as part of the formation of an integrated circuit.

The bottom layer 104 is the first layer of the tri-layer resist. In some cases, the bottom layer 104 may be referred to as an under-material layer. The material of the bottom layer 104 may be selected to perform a variety of functions. One function of the bottom layer 104 is to provide a more planar surface on which to deposit the middle layer 106 and photoresist 108. Specifically, after applying the material for the bottom layer 104, a CMP process is performed to substantially planarize the surface of the bottom layer. However, due to the underlying topography of the substrate 102, there may still be slight variations in height of the surface of the bottom layer 104. Specifically, portions of the bottom layer 104 that correspond to portions of the substrate 102 that have a lower height 112 may also be slightly lower.

The material of the bottom layer 104 may also be selected for other functions. In one example, the material may be a BARC material to aid the photolithography process with reduced reflection. A BARC material reflects less light and thus allows for a more precise pattern to be formed within the photoresist. In one example, the bottom layer 104 comprises a Spin-On Carbon (SOC) material. In one example, the bottom layer 104 comprises a novalac resin. Other materials are contemplated as well.

The middle layer 106 is deposited on the bottom layer 104. The middle layer 106 acts as a hard mask. Thus, the pattern that is formed into the overlying photoresist is transferred to the middle layer 106. Then, various etching processes are performed to transfer the pattern in the middle layer 106 through the bottom layer and to the underlying substrate 102.

In some embodiments, the middle layer 106 includes a polymer solution. According to the present example, the middle layer 106 includes a silicon-based resin. Thus, the middle layer 106 may also be referred to as a silicon-based resin layer. Such a resin is formed by first applying a first polymerization process to a monomer solution to create a partially processed resin solution. The first polymerization process may include heating the monomer solution to a temperature within a range of about 25 degrees Celsius to 150 degrees Celsius. In one example, the first polymerization process may include heating the monomer solution to a temperature of about 80 degrees Celsius. In one example, the temperature of the first polymerization process is less than the boiling point of the solvent. The monomer solution includes a variety of silicon-based monomers and a solvent. The first polymerization process causes the monomers to link together and form polymers. Such polymers form the silicon-based resin. The partially processed resin solution thus includes the solvent, the polymers, and some remaining monomers. Thereafter, the partially processed resin solution is deposited on the surface of the wafer, and more particularly, to the top surface of the bottom layer 104.

The solvent used for the monomer solution may be any appropriate solvent. For example, the solvent may include an alcohol type solvent, such as Propylene Glycol Methyl Ether (PGME), isopropyl alcohol, or n-butanol. In one example, the solvent is an organic solvent. In some examples, a co-solvent of water and organic solvent is used. In furtherance of the example, the water is less than 30 percent of the total solvent in volume.

In one example, the partially processed resin solution is applied using a spin coating process. For such a process, the partially processed resin solution is applied while the wafer spins on a wafer stage. After the spin coating process, a second polymerization process is applied to the partially processed resin solution. The second polymerization process includes a baking process. The baking process can remove remaining solvent and cause additional cross-link reactions to occur. Thus, the polymers within the partially processed resin solution are further cross-linked to form the resin with molecular weight greater than the molecular weight of the partially processed resin solution. The molecular weight refers to the average number of repeating units (monomers) of the corresponding macromolecules. In some embodiments, the molecular weight of the partially process resin solution after the second polymerization process is less than 2000 and the molecular weight of the resin after the second polymerization process is greater than 3000. According to principles described herein, it is desirable that the second polymerization process results in additional shrinkage of the middle layer. The first polymerization process and the second polymerization process can be tuned such that more shrinkage will occur during the second polymerization process. This results in a middle layer 106 that is more uniform in thickness and more conformal to the underlying bottom layer 104.

Before such shrinkage, as shown in FIG. 1A, there is greater variation in the middle layer 106 thickness. Specifically, the portion of the middle layer 106 that corresponds to the lower portion of the substrate 102 will have a greater thickness 114. The portion of the middle layer 106 that corresponds to the higher portion of the substrate 102 will have a smaller thickness. This creates undesired variation in the pattern features. For example, when forming an opening in the hard mask, the lateral etching bias is such that the opening at the top of the hard mask is greater than the opening at the bottom of the hard mask. A thicker hard mask leads to a greater difference between the size of the opening at the top and the opening at the bottom of the hard mask. Thus, it is desirable to have the middle layer 106 be as uniform in thickness as possible.

Figure 1B:
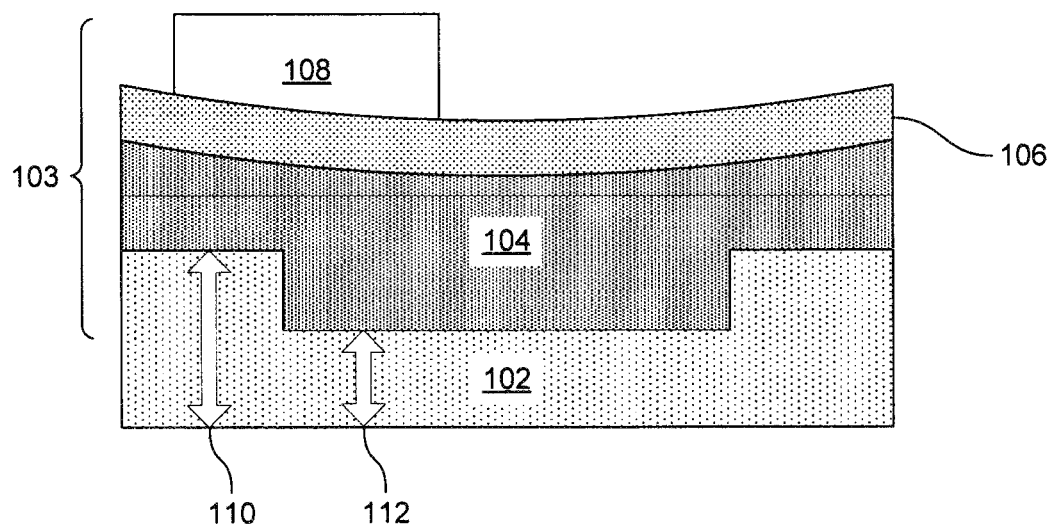
FIG. 1B is a diagram showing an illustrative tri-layer resist with a conformal middle layer, according to one example of principles described herein.

As will be described in more detail below, various techniques are used to cause additional shrinkage of the middle layer 106 during the second polymerization process. This leads to a middle layer 106 that is more uniform in thickness and thus more conformal to the bottom layer 104 as shown in FIG. 1B. In one example, after using principles described herein, the variation in thickness is less than 15 percent. In other words, the thickest portion of the middle layer 106 does not exceed 15 percent of the thickness of the thinnest portion of the middle layer 106.

FIG. 1B also illustrates a patterned resist layer 108 that is formed on the middle layer 106 to complete the tri-layer resist 103. The resist layer 108 may be any suitable resist material and is patterned by a suitable lithography process. In some embodiments, the resist material is a photoresist material sensitive photon beam and is patterned by a photolithography process. The photoresist layer 108 is designed such that after exposure to a light source through a patterned photomask, portions of the photoresist layer are soluble to a developing solution. By development, the pattern within the patterned photomask is transferred to the photoresist layer. Then the pattern is further transferred to the middle layer 106 and then to the substrate 102 as described above, by a suitable procedure, such as one (or more) etching process. In furtherance of the embodiments, the photoresist material is sensitive to ultraviolet (UV) light, deep ultraviolet (DUV) light or extreme ultraviolet (EUV) light. In some other embodiments, the resist material is sensitive to other radiation beam, such as electron-beam or ion beam. In this case, the lithography process is suitable lithography process to the corresponding radiation beam. For example, the resist material sensitive to electron-beam is patterned using an electron-beam lithography process, such as direct electron-beam writing. In various lithography technologies, a lithography process includes multiple operations, such as spin-on coating, exposure, development and one or more baking steps.

Figure 2A:
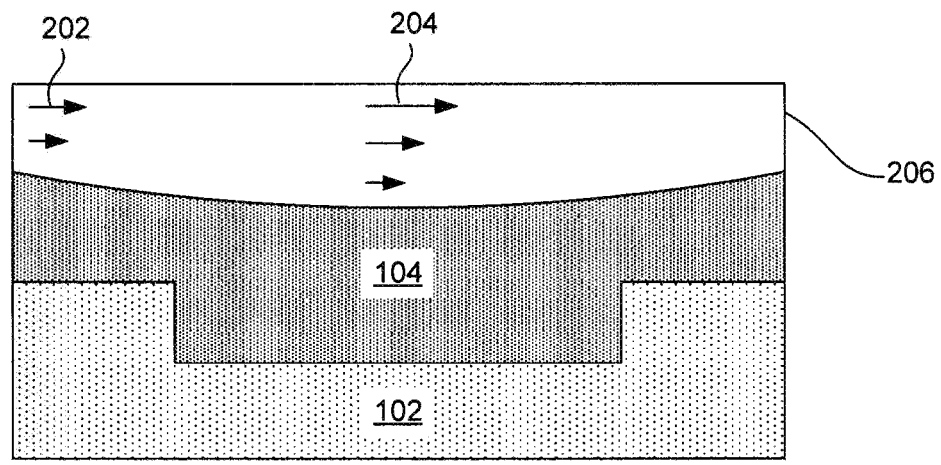
FIGS. 2A and 2B are diagrams showing an illustrative process for using a higher boiling point solvent to create a more conformal middle layer, according to one example of principles described herein.
Figure 2B:
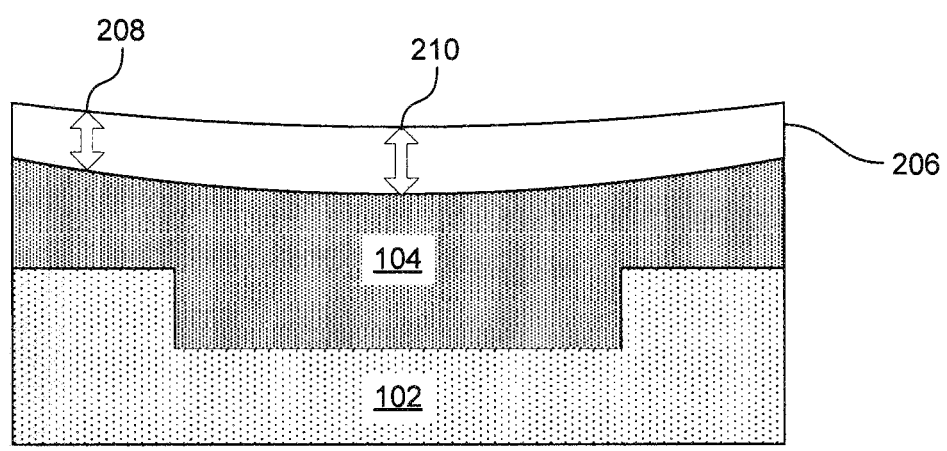

FIGS. 2A and 2B are diagrams showing an illustrative process for using a higher boiling point solvent to create a more conformal middle layer. As described above, the middle layer 106 includes a silicon-based resin. To form the middle layer 106, a monomer solution is first created. The monomer solution includes a number of monomers and a solvent. The monomer solution is then heated as part of the first polymerization process to cause cross-link reactions that cause the monomers to form polymers. This results in a solution that includes the solvent and partially cross-linked polymers (and monomers in some examples). Such a solution is referred to as partially processed resin solution. The polymers at this stage are referred to as partially cross-linked polymers since polymers thus formed still include cross-linkable sites for further cross-linking at subsequent stage. According to principles described herein, the solvent within the monomer solution has a high boiling point. Thus, less solvent will evaporate during the first polymerization process. This results in more solvent being present within the partially processed resin solution when the partially processed resin solution is applied to the wafer. Having more solvent within the partially processed resin solution can help cause more shrinkage for a variety of reasons.

FIG. 2A illustrates the partially processed resin solution 206 applied to the wafer. With more solvent within the partially processed resin solution 206, there is more solvent to be removed during the spin coating process. FIG. 2A illustrates the flow of the partially processed resin solution 206 during the spin coating process. The fluid dynamics of the partially processed resin solution 206 are such that fluid that is closer to the surface of the bottom layer 104 will flow more slowly than fluid that is farther away from the surface of the bottom layer 104. This is due to the viscosity of the partially processed resin solution 206 and the friction forces that are in effect. Thus, at areas where the topography is such that the middle layer 106 is thicker, there is more distance between the top surface of the middle layer 106 and the top surface of the bottom layer 104. Thus, the fluid at such portions will flow easily and faster than other portions. For example, the fluid flowing at portion 204 will flow faster than the fluid at portion 202. Because there is more solvent within the partially processed resin solution 206, the partially processed resin solution 206 can be more easily spun out at the portions where the middle layer 106 is thicker. Thus, as shown in FIG. 2B, after the spin coating process, the difference in height between point 208 and point 210 is less. Therefore the variation in thickness of the middle layer is much less.

Figure 3A:
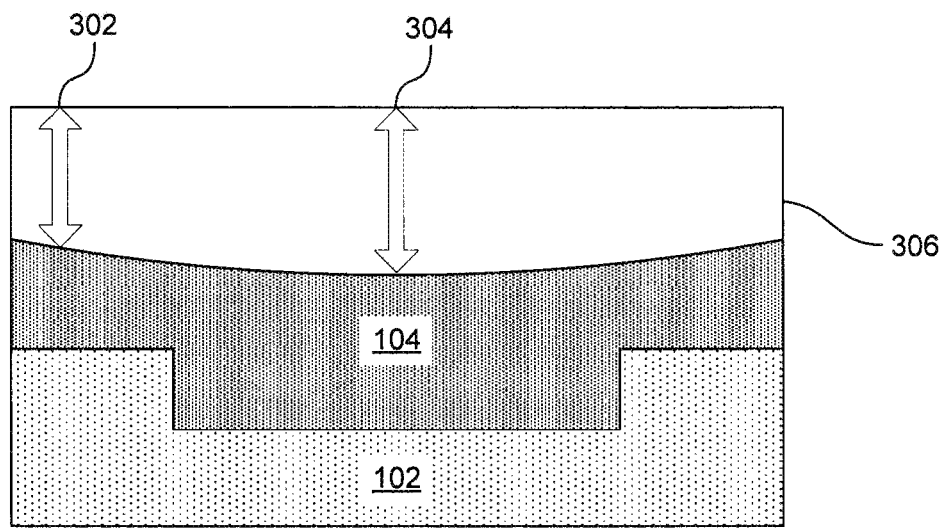
FIGS. 3A and 3B are diagrams showing an illustrative process for using a resin that shrinks more during a baking process to create a more conformal middle layer, according to one example of principles described herein.
Figure 3B:
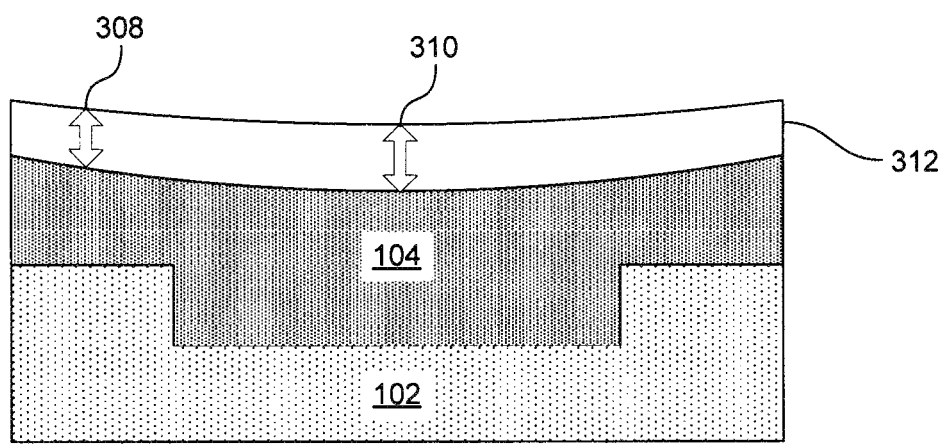

FIGS. 3A and 3B are diagrams showing an illustrative process for using a partially processed resin solution 306 that shrinks more during a baking process to create a more conformal middle layer. According to the present example, the partially processed resin solution 306 is designed to shrink more during the baking process. One way to do this is by using monomers that produce a greater number of cross-link reactions during the baking process, such as having more cross-linking sites. More detail on such a technique will be described in further detail below with the text accompanying FIG. 4. Another way to cause additional shrinkages is to increase the baking temperature to cause more cross-link reactions during the second polymerization process. Either or both techniques may be used to cause additional shrinkage of the middle layer during baking.

Additionally, by using a high boiling point solvent, using a lower temperature for the first polymerization process, and using a higher temperature for the second polymerization process, there will be more shrinkage of the middle layer during the second polymerization process. Specifically, the lower temperature of the first polymerization process will allow more solvent to remain in the partially processed resin solution when it is applied to the wafer. Then, that additional solvent is removed during the baking process of the second polymerization process. Because there is additional solvent to be removed during this process, there is more shrinkage of the middle layer. Furthermore, the lower temperature of the first polymerization process will limit the cross-linking reaction in the partially processed resin solution to a lower level. Then, more cross-linking reactions occur during the baking process of the second polymerization process. Because there more cross-linking reactions occur during the baking process, there is more shrinkage of the middle layer. In some embodiments, the baking temperature associated with the second polymerization process is greater than the boiling point of the solvent. In furtherance of the embodiments, the lower temperature of the first polymerization is less than the boiling point of the solvent.

Causing more shrinkage helps produce a more uniform middle layer by reducing the variance between different thicknesses. To illustrate this point, in one example, point 302 has a thickness of 50 nanometers and point 304 has a thickness of 100 nanometers. In one baking process, the thickness of the middle layer is reduced by 80 percent. After such a baking process, the thickness at point 302 is 40 nanometers and the thickness at point 304 is 80 nanometers. The difference between the two points 302, 304 would thus be 40 nanometers. But, if more shrinkage occurs the variation between the two points is reduced. For example, if the baking process reduces the thickness by 50 percent, then after such a process, point 302 will have a thickness of 25 nanometers and point 304 will have a thickness of 50 nanometers. The difference between the two points 302, 304 in such a case is 25 nanometers, which is less than the 40 nanometers in the previous case where the shrinkage causes only a reduction of thickness by 80 percent. Thus, more shrinkage results in less variation of thickness of the middle layer. The above example is used for discussion purposes and does not necessarily represent a practicable situation for principles described herein.

FIG. 3B illustrates the middle layer 312 after a baking process occurs. Using principles described herein, additional shrinkage occurs, thus causing a more uniform and conformal middle layer. Thus, the difference in thickness from point 308 to point 310 is substantially reduced.

Figure 4A:
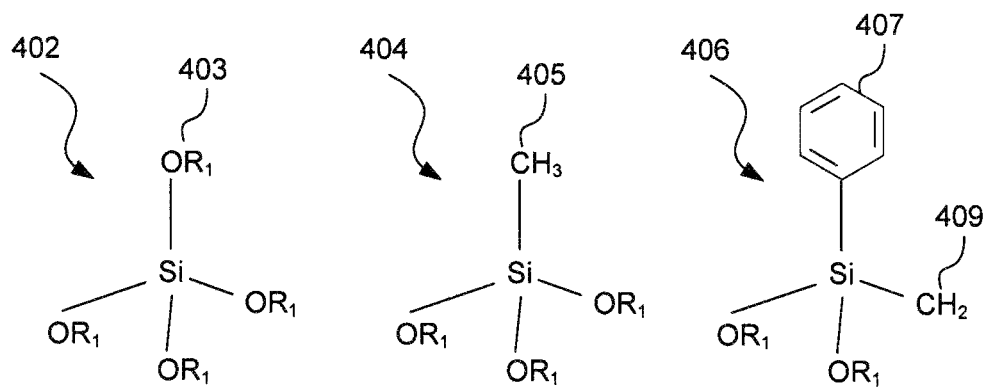
FIG. 4A is a diagram showing illustrative monomers that may be used to form the polymer resin used for the middle layer, according to one example of principles described herein.

FIG. 4A is a diagram showing illustrative monomers that may be used to form the polymer resin used for the middle layer. A first silicon-based monomer 402 includes a functional group 403 on all four sides. Specifically, each side includes the functional group 403 $OR_1$. The $R_1$ may represent a variety of other elements or molecules including, but not limited to, C, $CH_2$, or $CH_3$. The functional group 403 is able to be cross-linked with another monomer or polymer. Thus, at four locations, the monomer 402 is able to cross-link with other monomers and/or polymers.

A second silicon-based monomer 404 includes a functional group 405 that is not able to form a cross-link. The remaining sides include the functional group $OR_1$, which is able to form a cross-link. Thus, at three locations, the monomer 404 is able to form a cross-link with other monomers and/or polymers.

A third silicon-based monomer 406 includes functional group 407, 409 that are not able to form cross-links. The remaining sides include the functional group $OR_1$, which is able to form a cross-link. Thus, at two locations, the monomer 406 is able to form a cross-link with other monomers and/or polymers.

As described above, it is desirable to have more cross-link reactions during the second polymerization process in order to cause more shrinkage of the partially processed resin solution. Thus, the monomer solution can include more monomers like monomer 402 that can form cross-links on all four sides. In one example, the ratio of monomers like monomer 402 that can form cross-links on all four sides to the total number of monomers in the monomer solution is greater than 50 percent.

The monomers 402, 404, 406 that can be used in the monomer solution can be combined to form polymers that form the silicon-based resin. Such monomers may be referred to as silioxane because they include a silicon-oxygen-silicon bond. Siloxane can form the backbone of silicon-based resins that are used to form the middle layer.

Figure 4B:
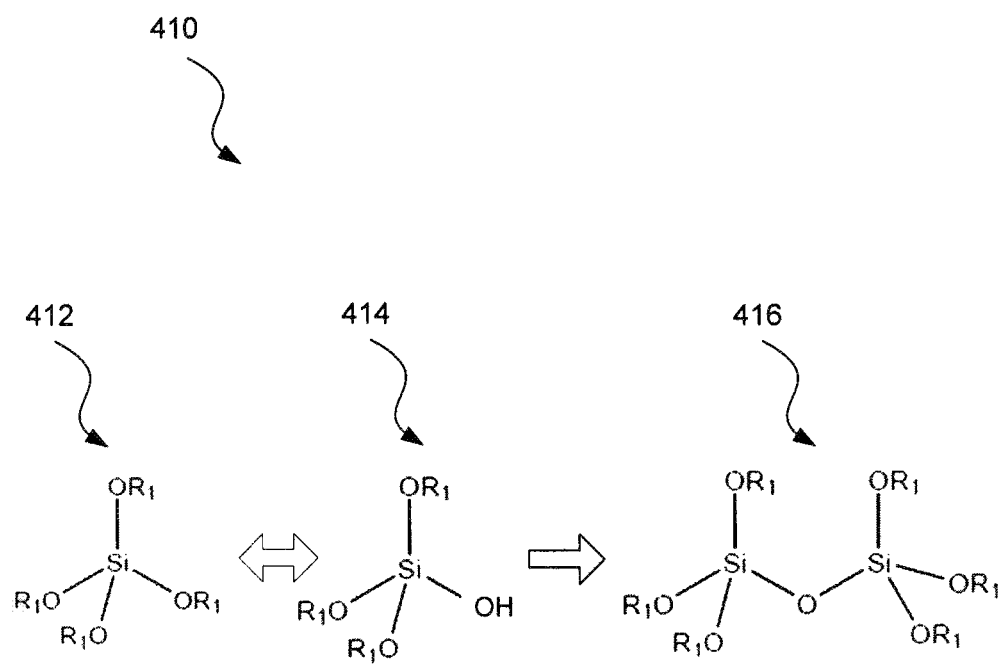
FIG. 4B is a diagram showing an illustrative chemical reaction between two monomers to create a polymer, according to one example of principles described herein.

FIG. 4B is a diagram showing an illustrative chemical reaction between two monomers 412, 414 to create a polymer 416. Monomer 412 can form a cross-link on all four sides because the functional group on each side is $OR_1$. Likewise, monomer 414 can form a cross-link on all four sides. While monomer 414 has a different functional group of OH for one side, such a functional group is also capable of forming a cross-link. The polymer 416 has six locations at which a cross-link can occur. Thus, more monomers can be added to the polymer 416 to increase the size of the polymer and the molecular weight.

Figure 5:
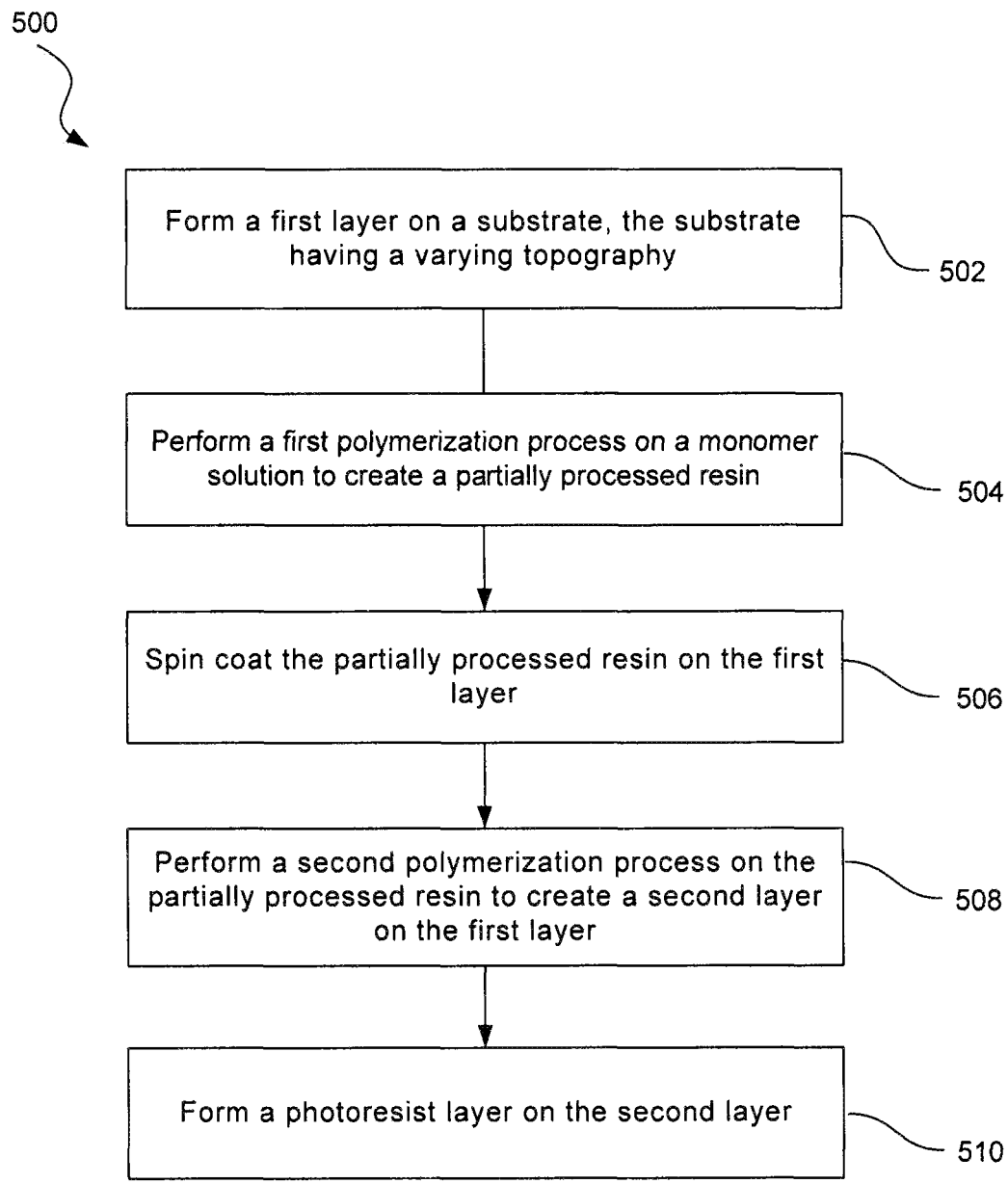
FIG. 5 is a flowchart showing an illustrative method for forming a tri-layer resist with a more conformal middle layer, according to one example of principles described herein.

FIG. 5 is a flowchart showing an illustrative method 500 for forming a tri-layer resist with a more conformal middle layer. According to the present example, the method 500 includes a step 502 for forming a first layer on a substrate. The first layer may be one of several types of materials. For example, as described above, the first layer of the tri-layer resist may be a BARC material, an SOC material, or a novalac resin. The first layer may be applied to a substrate that has a varying topography. For example, the substrate may have a variety of features formed therein that cause the top surface of the substrate to have varying heights.

After application of the first layer, a CMP process is performed to planarize the top surface of the first layer. Due to the underlying topography variations of the substrate, the top surface of the first layer will not be perfectly planar. Specifically, portions of the first layer that correspond to portions of the substrate that have a lower height will be lower than other portions of the first layer. Thus, the varying surface of the first layer can lead to a middle layer that has a varying thickness. To reduce the varying thickness of the middle layer, varying techniques as described herein can be used.

The method 500 further includes a step 504 for performing a first polymerization process on a monomer solution to create a partially processed resin solution. The partially processed resin solution is the material that is used to form the middle layer. The monomer solution includes a solvent and a number of silicon-based monomers. The first polymerization process is designed to cause a minimum amount of cross-link reactions of the monomers. For example, as described above, the solvent used in the monomer solution can have a high boiling point so that less solvent will evaporate during the first polymerization process. The first polymerization process may involve heating the monomer solution to create some cross-link reactions. In the present embodiment, the heating temperature is less than the boiling point of the solvent. In one example, a temperature within a range of about 25-150 degrees Celsius, such as 80 degrees Celsius, is applied to the monomer solution to create a few cross-link reactions and create a partially processed resin solution. According to principles described herein, it is desirable that this process does not create fully cross-linked polymers. Instead, it is desired that there be more cross-links that occur after the partially processed resin solution is applied to the wafer. In one example, the molecular weight of the polymers after the first polymerization process is less than 2000. When the molecular weight is used in the present disclosure, it usually refers to an average molecular weight. In some embodiments, the monomers used to form the partially processed resin solution include more monomers with greater cross-linking sites, such as 412. In furtherance of the embodiments, the ratio of monomers like monomer 402 that can form cross-links on all four sides to the total number of monomers in the monomer solution is greater than 50 percent. Additionally, the ratio of cross-links that have already occurred to available cross-linkable locations may be within a range of about 15% to 40%.

The method 500 further includes a step 506 for spin coating the partially processed resin solution on the first layer. As described above, spin coating involves spinning the wafer secured on a wafer stage while applying a material to the wafer. In this case, the partially processed resin solution is applied on the top surface of the first layer. The partially processed resin solution includes the solvent and partially cross-linked polymers (or additionally some monomers) with limited molecular weight. In some examples, the molecular weight of the polymers is less than 2000. Because the solvent used in the original monomer solution has a high boiling point, there is more solvent remaining within the partially processed resin solution. Having more solvent within the partially processed resin solution makes the resin easier to spin out and thus leads to a more conformal and more uniform middle layer.

The method 500 further includes a step 508 for performing a second polymerization process, which includes a baking process, on the partially processed resin solution to create the second layer (or middle layer) of the tri-layer resist. The baking process may be part of the second polymerization process that is used to complete the middle layer. The baking process will cause the partially processed resin solution to shrink. Such shrinkage occurs for a variety of reasons. First, there is more solvent than normal within the partially processed resin solution because the solvent has a higher than normal boiling point. Such solvent may thus evaporate during the baking process instead of during the first polymerization process. In the present embodiment, the heating temperature of the first polymerization process is less than the boiling point and the baking temperature of the second polymerization process is greater than the boiling point. Second, the partially processed resin solution has several cross-linkable locations within the monomers and polymers already created. Thus, several more cross-link reactions will occur during the baking process. This creates resin molecules with greater molecular weight and thus leads to more shrinkage of the partially processed resin solution. In one example, the molecular weight of the polymers after the additional cross-link reactions occur during the baking process is greater than 3000 while the molecular weights of the polymers in the partially processed resin solution is less than 2000. In one example, the thickness of the partially processed resin solution before the baking process may be within a range of about 150 to 300 angstroms. After the baking process, the thickness may be in a range of about 130 to 200 angstroms. Such shrinkage allows for a more conformal and more uniform middle layer. In one example, the variation of thickness in the middle layer after the above described process may be less than 15 percent.

According to one example, a method includes performing a first polymerization process on a monomer solution to form a partially processed resin solution, the partially processed resin solution comprising a solvent and a silicon-based resin, spin coating the partially processed resin solution on a substrate, and performing a second polymerization process on the partially processed resin solution to shrink the partially processed resin solution to form a conformal silicon-based resin layer.

According to one example, a method includes performing a first polymerization process with a first processing temperature on a monomer solution to form a partially processed resin solution, wherein a percentage of monomers in the monomer solution that have four cross-linkable sides is greater than 50 percent and the partially processed resin solution includes a solvent and a silicon-based resin, spin coating the partially processed resin solution on a substrate, and performing a second polymerization process with a second processing temperature on the partially processed resin solution, thereby shrinking the partially processed resin solution to form a silicon-based resin layer.

According to one example, a method includes forming a first layer on a substrate, the substrate having a varying topography, performing a first polymerization process on a monomer solution to form a partially processed resin solution, the partially processed resin solution comprising a solvent and a silicon-based resin, the silicon-based resin having a molecular weight that is less than 2000, spin coating the partially processed resin solution on the first layer, performing a baking process on the partially processed resin solution to create a second layer, the baking process using a temperature that is greater than a boiling point of the solvent, and forming a photoresist material on the second layer. After the baking process, the second layer is substantially uniform in thickness such that variation of thickness is less than 15 percent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a bottom layer of a tri-layer resist on a substrate, the substrate having variations in height such that a top surface of the bottom layer has a cupping shape;
   performing a first polymerization process on a solution of monomers to form a partially processed resin solution, the partially processed resin solution comprising a solvent, the monomers, and a silicon-based resin;
   after the performing of the first polymerization process, spin coating the partially processed resin solution on the bottom layer of the tri-layer resist to form a middle layer of the tri-layer resist;
   performing a second polymerization process on the partially processed resin solution spin-coated on the substrate to shrink the partially processed resin solution spin-coated on the substrate to form a conformal silicon-based resin layer that conforms to the cupping shape of the top surface of the bottom layer; and
   forming a patterned photoresist layer as a top-layer of the tri-layer resist directly on the middle layer of the tri-layer resist.

2. The method of claim 1, wherein
   the solution of monomers includes first-type monomers that each have four cross-linkable reactive ends; and
   a percentage of the first-type monomers over the monomers in the solution of the monomers is greater than 50 percent.

3. The method of claim 1, wherein the silicon-based resin layer comprises a siloxane material.

4. The method of claim 1, wherein a molecular weight of polymers within the partially processed resin solution is less than 2000.

5. The method of claim 4, wherein a molecular weight of polymers within the silicon-based resin layer is greater than 3000 after the second polymerization process.

6. The method of claim 1, wherein the solvent has a boiling point that is greater than 150 degrees Celsius.

7. The method of claim 1, wherein the solvent comprises an organic solvent and water.

8. The method of claim 7, wherein a ratio of water to organic solvent in volume is less than 30 percent.

9. The method of claim 1, wherein the first polymerization process comprises heating the solution of the monomers at a temperature lower than a boiling point of the solvent.

10. The method of claim 9, wherein the second polymerization process comprises baking the substrate spin-coated with the partially processed resin solution at a temperature greater than the boiling point of the solvent.

11. The method of claim 1, wherein the bottom layer of the tri-layer resist comprises at least one of: a Bottom Anti-Reflective Coating (BARC) material, a Spin-On Carbon (SOC) material, and a novolac resin.

12. The method of claim 1, wherein a ratio of a total of available reactive ends in the partially process resin solution to a total number of available reactive ends in the solution of monomers is between 15% to 40%.

13. A method comprising:
  depositing a bottom layer of a tri-layer resist on a substrate, the substrate having variations in height;
  performing a first polymerization process with a first processing temperature on a solution of monomers to form a partially processed resin solution, the partially processed resin solution including a solvent, the monomers and a silicon-based resin, wherein a percentage of the monomers in the solution that have four cross-linkable reactive ends is greater than 50 percent;
  after the performing of the first polymerization process, forming a middle layer of the tri-layer resist by spin coating the partially processed resin solution on the bottom layer of the tri-layer resist;
  performing a second polymerization process with a second processing temperature on the partially processed resin solution spin-coated on the substrate, thereby shrinking the partially processed resin solution spin-coated on the substrate to form a silicon-based resin layer; and
  forming a patterned top layer of the tri-layer resist directly on the middle layer of the tri-layer resist.

14. The method of claim 13, wherein the first processing temperature is lower than the second processing temperature and a boiling point of the solvent.

15. The method of claim 14, wherein the second processing temperature is greater than the boiling point of the solvent.

16. The method of claim 13, wherein the first polymerization process comprises heating the solution of monomers and the first processing temperature is about 80 degrees Celsius.

17. The method of claim 13, wherein a ratio of a total of available reactive ends in the partially process resin solution to a total number of available reactive ends in the solution of monomers is between 15% to 40%.

18. A method comprising:
  forming a first layer of a tri-layer resist on a substrate, the substrate having a varying topography;
  performing a first polymerization process on a solution of monomers to form a partially processed resin solution, the partially processed resin solution comprising a solvent, the monomers, and a silicon-based resin, the silicon-based resin having a molecular weight that is less than 2000;
  after the performing of the first polymerization process, forming a second layer of the tri-layer resist by spin coating the partially processed resin solution on the first layer;
  performing a baking process on the partially processed resin solution spin-coated on the first layer to create a second layer, the baking process using a temperature that is greater than a boiling point of the solvent; and
  forming a third layer of the tri-layer resist by forming a photoresist material directly on the second layer,
  wherein, after the baking process, the second layer is substantially uniform in thickness such that variation of thickness is less than 15 percent.

19. The method of claim 18, wherein the molecular weight of the second layer after the baking process is greater than 3000.

20. The method of claim 18, wherein a ratio of monomers that have four cross-linkable reactive ends to all monomers within the solution of monomers is greater than 50 percent.

* * * * *